(12) United States Patent
Mikhaylichenko et al.

(10) Patent No.: US 9,984,867 B2
(45) Date of Patent: May 29, 2018

(54) SYSTEMS AND METHODS FOR RINSING AND DRYING SUBSTRATES

(71) Applicant: Applied Materials, Inc., Santa Clara, CA (US)

(72) Inventors: Ekaterina Mikhaylichenko, San Jose, CA (US); Brian J. Brown, Palo Alto, CA (US); Kyle M. Hanson, Kalispell, MT (US); Vincent S. Francischetti, Columbia Falls, MT (US)

(73) Assignee: Applied Materials, Inc., Santa Clara, CA (US)

( * ) Notice: Subject to any disclaimer, the term of this patent is extended or adjusted under 35 U.S.C. 154(b) by 443 days.

(21) Appl. No.: 14/602,201

(22) Filed: Jan. 21, 2015

(65) Prior Publication Data

US 2016/0181086 A1    Jun. 23, 2016

Related U.S. Application Data

(60) Provisional application No. 62/094,938, filed on Dec. 19, 2014.

(51) Int. Cl.
*H01L 21/02* (2006.01)
*H01L 21/67* (2006.01)
(Continued)

(52) U.S. Cl.
CPC .......... *H01L 21/02054* (2013.01); *B08B 3/08* (2013.01); *H01L 21/67028* (2013.01);
(Continued)

(58) Field of Classification Search
CPC .. H01L 21/67017–21/67086; H01L 21/02054; H01L 21/67751; H01L 21/67736; H01L 21/67733
See application file for complete search history.

(56) References Cited

U.S. PATENT DOCUMENTS 5,381,808 A * 1/1995 Kamikawa ................ B08B 3/06
                                                                134/114
5,660,642 A    8/1997 Britten
(Continued)

FOREIGN PATENT DOCUMENTS

KR    2006-0112356 A    11/2006
WO    WO 2007/014289 A2    2/2007
(Continued)

OTHER PUBLICATIONS

Velazquez et al., U.S. Appl. No. 14/602,114, titled "Substrate Edge Residue Removal Systems, Apparatus, and Methods," filed Jan. 21, 2015.
(Continued)

*Primary Examiner* — Spencer E Bell
(74) *Attorney, Agent, or Firm* — Dugan & Dugan, PC

(57) ABSTRACT

In some embodiments, a system is provided that includes (1) a loading position; (2) a drying position; (3) a movable tank configured to (a) hold at least one substrate; (b) hold a cleaning chemistry so as to expose a substrate within the movable tank to the cleaning chemistry; and (c) translate between the loading position and the drying position; and (4) a drying station located at the drying position and configured to rinse and dry a substrate as the substrate is unloaded from the movable tank when the movable tank is at the drying position. Numerous other aspects are provided.

17 Claims, 10 Drawing Sheets

(51) Int. Cl.
   *H01L 21/677*   (2006.01)
   *B08B 3/08*     (2006.01)
(52) U.S. Cl.
   CPC .. *H01L 21/67034* (2013.01); *H01L 21/67057* (2013.01); *H01L 21/67733* (2013.01); *H01L 21/67736* (2013.01); *H01L 21/67751* (2013.01)

(56) References Cited

U.S. PATENT DOCUMENTS

| | | | |
|---|---|---|---|
| 6,027,574 | A | 2/2000 | Fishkin et al. |
| 6,575,177 | B1 | 6/2003 | Brown et al. |
| 7,718,011 | B2 | 5/2010 | Fishkin et al. |
| 7,980,255 | B2 | 7/2011 | Achkire et al. |
| 8,322,045 | B2 | 12/2012 | Stein et al. |
| 8,869,422 | B2 | 10/2014 | Velazquez et al. |
| 2002/0005215 | A1 | 1/2002 | Florez |
| 2002/0053319 | A1* | 5/2002 | Nagamine ......... H01L 21/67051 118/52 |
| 2002/0121290 | A1 | 9/2002 | Tang et al. |
| 2007/0079932 | A1 | 4/2007 | Mimken et al. |
| 2007/0295371 | A1* | 12/2007 | Achkire ............... B08B 3/10 134/61 |
| 2009/0044839 | A1 | 2/2009 | Stein et al. |
| 2013/0081301 | A1 | 4/2013 | Gouk et al. |
| 2013/0283634 | A1 | 10/2013 | Velazquez et al. |
| 2015/0000711 | A1 | 1/2015 | Brown |

FOREIGN PATENT DOCUMENTS

| | | |
|---|---|---|
| WO | WO 2007/143476 A2 | 12/2007 |
| WO | WO 2008/021265 A2 | 2/2008 |

OTHER PUBLICATIONS

Velazquez et al., U.S. Appl. No. 14/593,841, titled "Substrate Holder Assembly, Apparatus, and Methods," filed Jan. 9, 2015.
Velazquez et al., U.S. Appl. No. 14/602,094, titled "Substrate Gripper Apparatus and Methods," filed Jan. 21, 2015.
International Search Report and Written Opinion of International Application No. PCT/US2015/066924 dated Mar. 31, 2016.
International Preliminary Report on Patentability of International Application No. PCT/U52015/066924 dated Jun. 29, 2017.

* cited by examiner

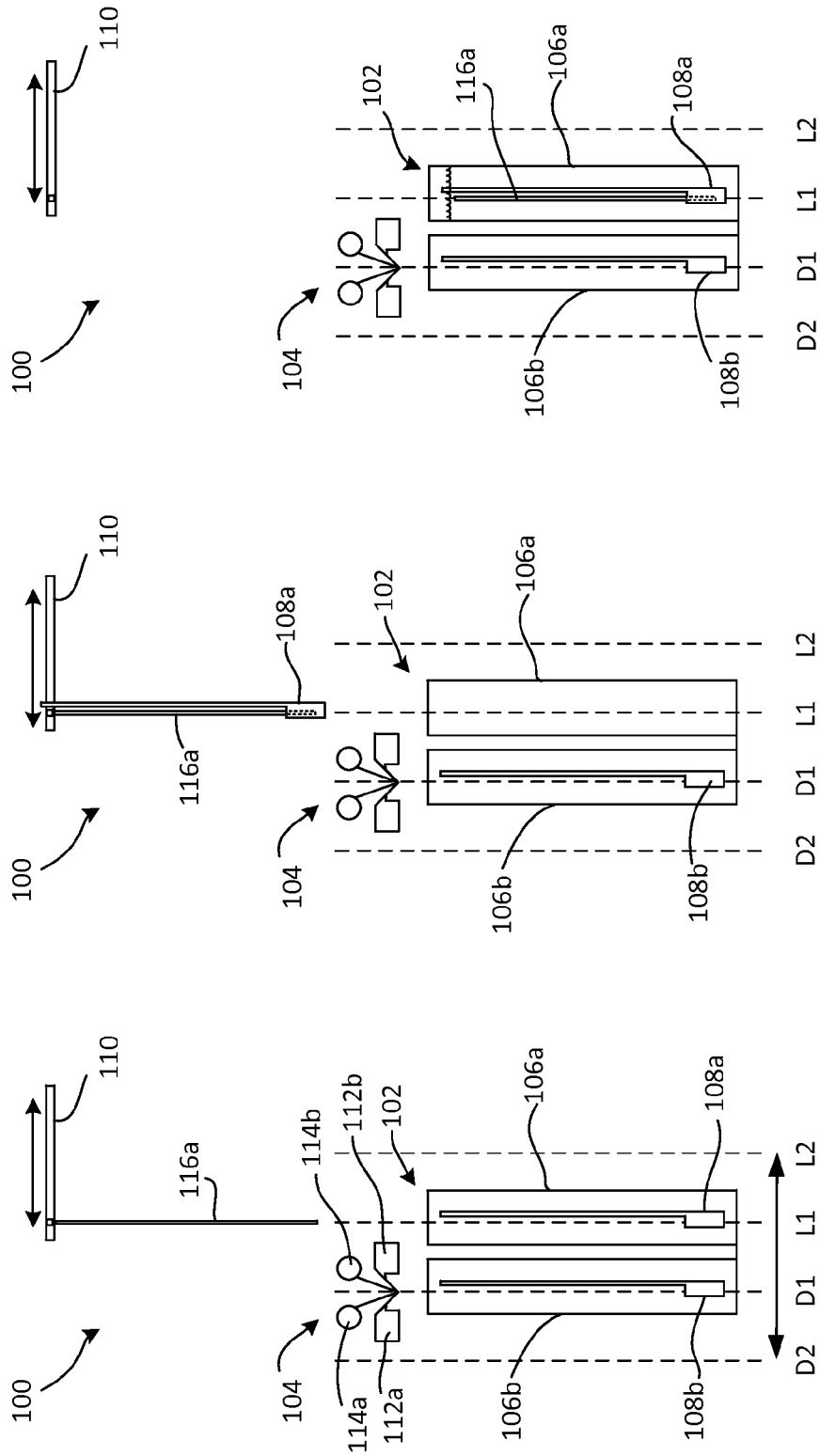

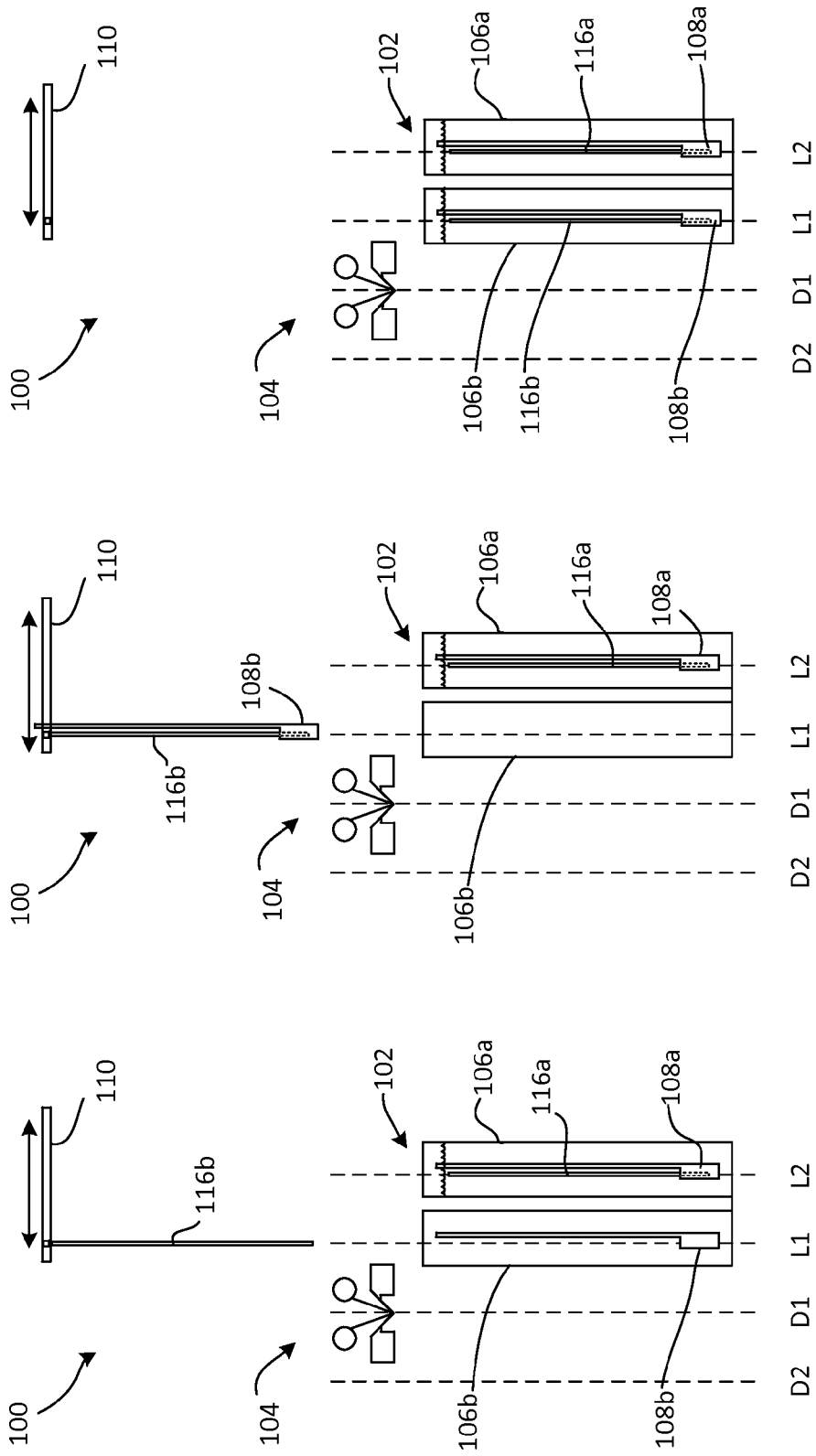

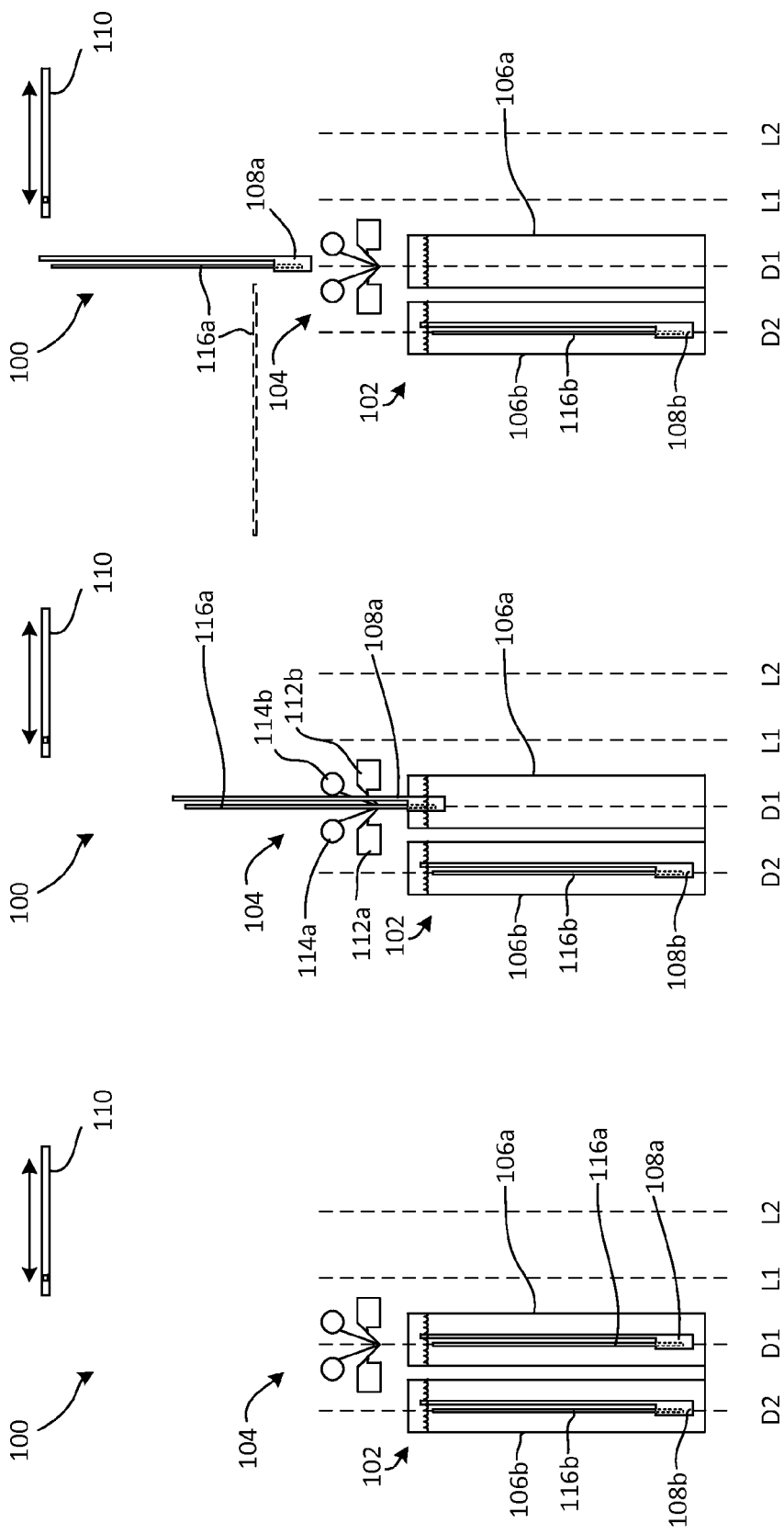

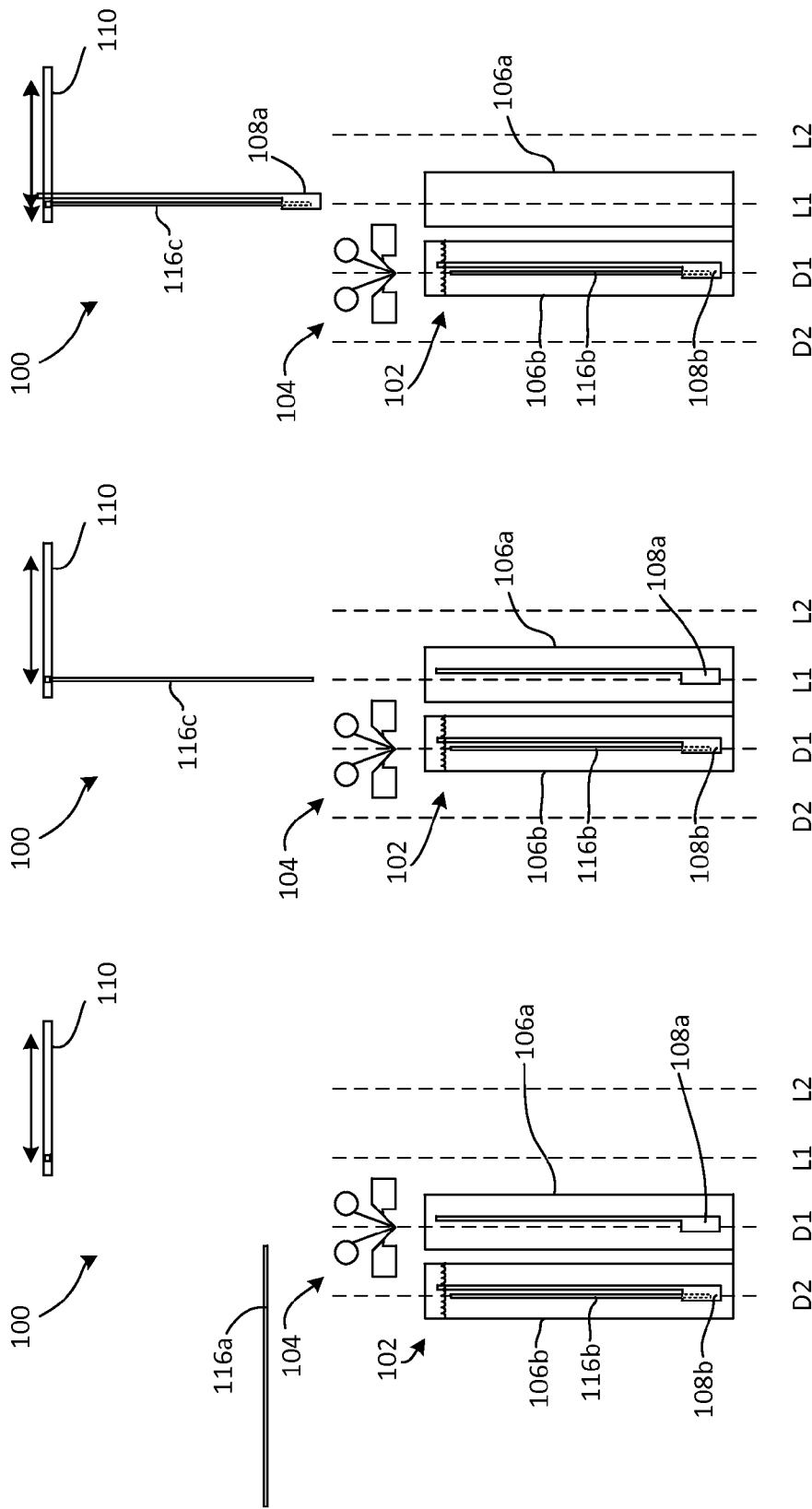

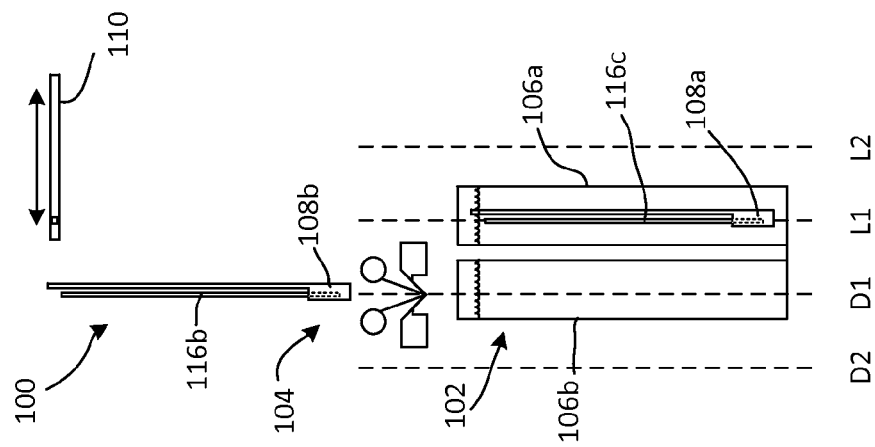
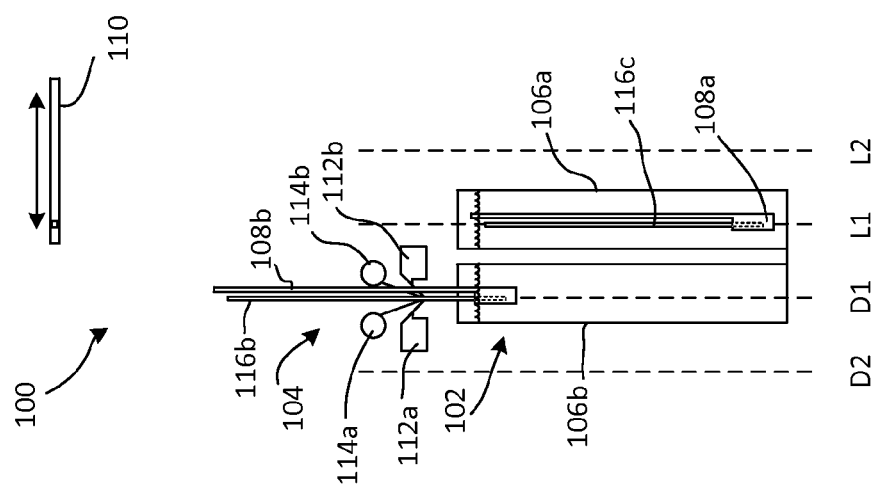
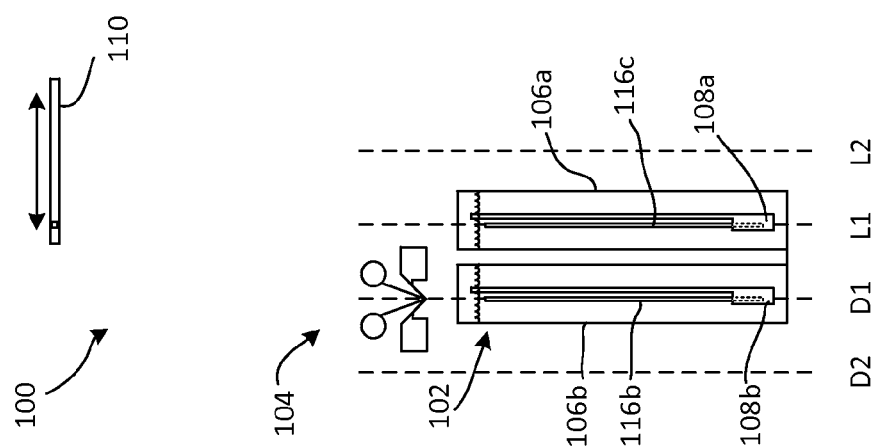

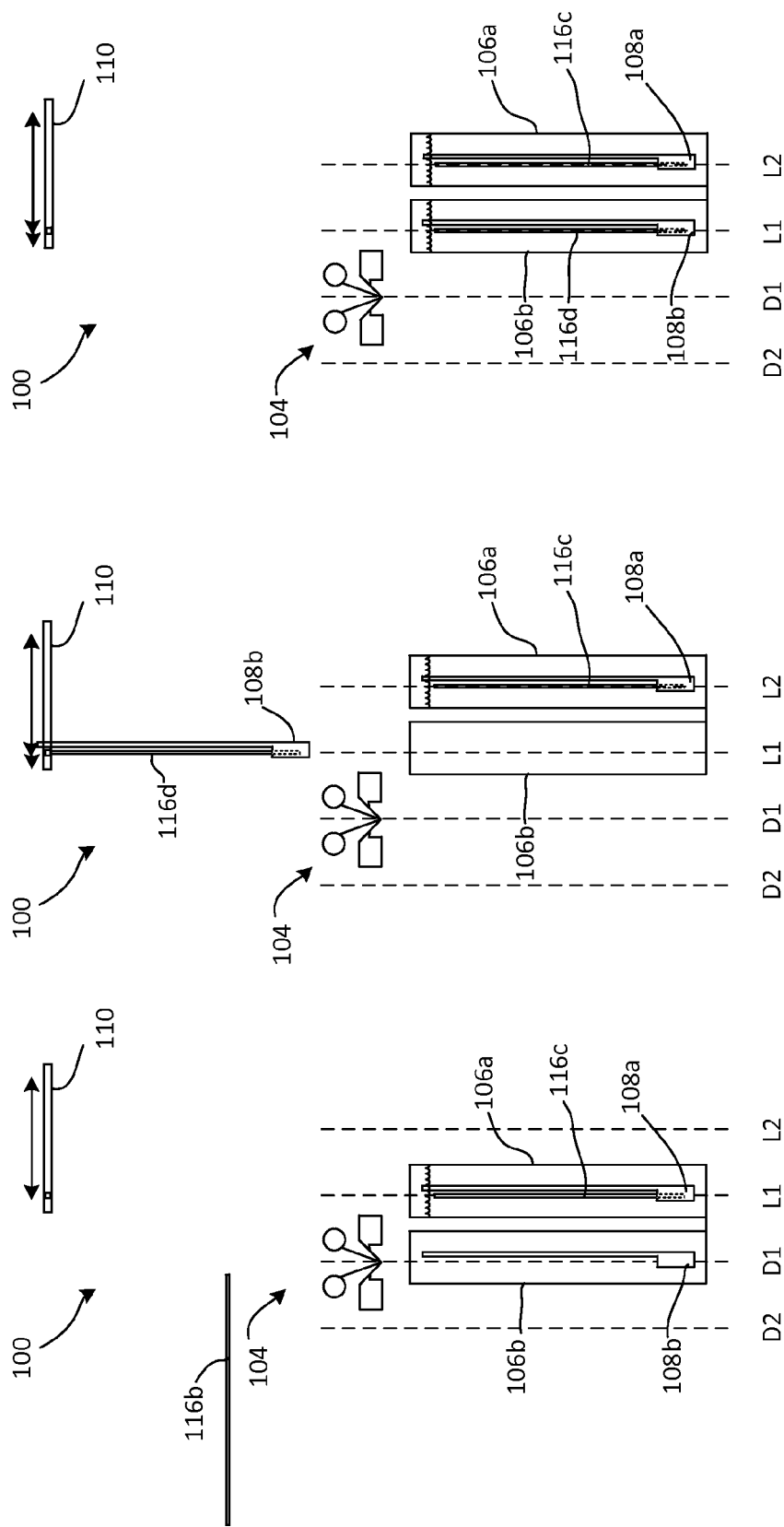

SYSTEMS AND METHODS FOR RINSING AND DRYING SUBSTRATES

RELATED APPLICATIONS

The present application claims priority from U.S. Application Ser. No. 62/094,938, filed Dec. 19, 2014, and titled "SUBSTRATE RINSING SYSTEMS AND METHODS", which is hereby incorporated by reference herein in its entirety for all purposes.

The present application is related to U.S. application Ser. No. 14/593,841, filed Jan. 9, 2015, and titled "SUBSTRATE HOLDER ASSEMBLY, APPARATUS, AND METHODS", which is hereby incorporated by reference herein in its entirety for all purposes.

The present application is related to U.S. application Ser. No. 14/602,094, filed Jan. 21, 2015, and titled "SUBSTRATE GRIPPER APPARATUS AND METHODS", which is hereby incorporated by reference herein in its entirety for all purposes.

The present application is related to U.S. application Ser. No. 14/602,114, filed Jan. 21, 2015, and titled "SUBSTRATE EDGE RESIDUE REMOVAL SYSTEMS, APPARATUS, AND METHODS", which is hereby incorporated by reference herein in its entirety for all purposes.

FIELD

The present application relates to semiconductor device manufacturing and is more particularly related to systems and methods for rinsing and drying substrates.

BACKGROUND

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) may be employed. After removal from the rinsing bath, absent use of a drying apparatus, bath fluid may evaporate from the substrate's surface and cause streaking, spotting and/or leave bath residue on the surface of the substrate. Such streaking, spotting and residue can cause subsequent device failure. Accordingly, much attention has been directed to improved methods for drying a substrate as it is removed from an aqueous bath.

A method known as Marangoni drying creates a surface tension gradient to induce bath fluid to flow from the substrate in a manner that leaves the substrate virtually free of bath fluid, and thus may avoid streaking, spotting and residue marks. Specifically, during Marangoni drying a solvent miscible with the bath fluid (e.g., IPA vapor) is introduced to a fluid meniscus which forms as the substrate is lifted from the bath or as the bath fluid is drained past the substrate. The solvent vapor is absorbed along the surface of the fluid, with the concentration of the absorbed vapor being higher at the tip of the meniscus. The higher concentration of absorbed vapor causes surface tension to be lower at the tip of the meniscus than in the bulk of the bath fluid, causing bath fluid to flow from the drying meniscus toward the bulk bath fluid. Such a flow is known as a "Marangoni" flow, and can be employed to achieve substrate drying with reduced streaks, spotting or bath residue on the substrate.

Achieving uniform Marangoni drying of a substrate can be difficult and in some cases particles from the bath fluid may re-attach to and contaminate the substrate. As such, methods and apparatus for reducing particle re-attachment during substrate rinsing and/or drying are desired.

SUMMARY

In some embodiments of the invention, a system is provided that includes (1) a loading position; (2) a drying position; (3) a movable tank configured to (a) hold at least one substrate; (b) hold a cleaning chemistry so as to expose a substrate within the movable tank to the cleaning chemistry; and (c) translate between the loading position and the drying position; and (4) a drying station located at the drying position and configured to rinse and dry a substrate as the substrate is unloaded from the movable tank when the movable tank is at the drying position.

In some embodiments of the invention, a method is provided that includes (1) providing a movable tank configured to hold at least one substrate and to translate between a loading position and a drying position; (2) providing a drying station located at the drying position and configured to rinse and dry a substrate as the substrate is unloaded from the movable tank when the movable tank is at the drying position; (3) positioning the movable tank at the loading position; (4) loading a substrate into the movable tank while the movable tank is at the loading position; (5) filling the movable tank with a cleaning chemistry; (6) treating the substrate with the cleaning chemistry for a predetermined time period; (7) moving the movable tank to the drying position; (8) unloading the substrate from the movable tank through the drying station; and (9) rinsing the substrate with a rinsing fluid and drying the substrate as the substrate is unloading from the movable tank through the drying station.

In some embodiments of the invention, a system is provided that includes (1) a first loading position, a second loading position, a first drying position and a second drying position; (2) a movable tank configured to translate between the first and second loading positions and the first and second drying positions, the movable tank having (a) a first fillable and drainable compartment configured to hold a cleaning chemistry so as to expose a substrate within the first compartment of the movable tank to the cleaning chemistry; and (b) a second fillable and drainable compartment configured to hold a cleaning chemistry so as to expose a substrate within the second compartment of the movable tank to the cleaning chemistry; and (3) a drying station configured to (a) rinse and dry a substrate as the substrate is unloaded from the first compartment of the movable tank when the movable tank is positioned below the drying station at the first drying position; and (b) rinse and dry a substrate as the substrate is unloaded from the second compartment of the movable tank when the movable tank is positioned below the drying station at the second drying position. Numerous other embodiments and/or aspects are provided.

Other features and aspects of the present invention will become more fully apparent from the following detailed description of example embodiments, the appended claims, and the accompanying drawings.

BRIEF DESCRIPTION OF THE DRAWINGS

FIGS. 1A-1R are side schematic views of an example system for rinsing and drying substrates in accordance with embodiments of the present invention.

DETAILED DESCRIPTION

Figure 1S:
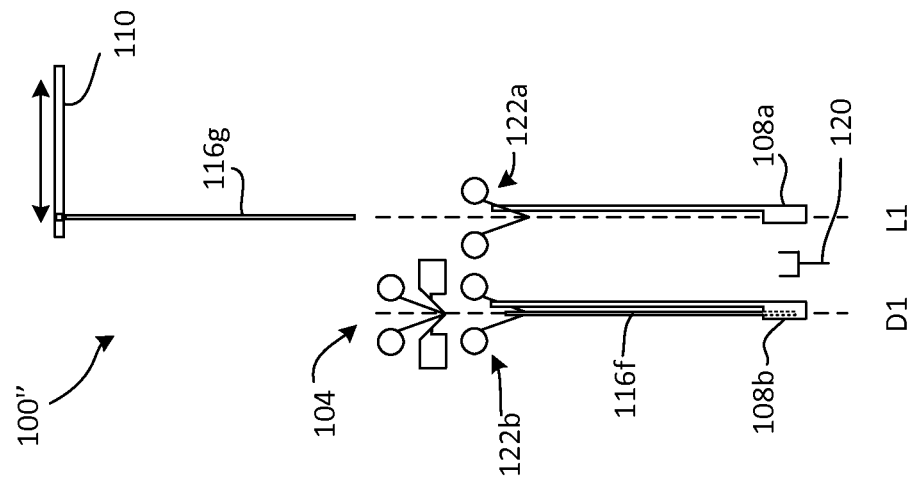
FIG. 1S is a side schematic view of a first alternative system for rinsing and drying substrates in accordance with embodiments of the present invention.

As described previously, in some instances, particles from rinsing bath fluid used to rinse a substrate following a cleaning process may re-attach to and contaminate the substrate. For example, particles may re-attach to the substrate if the rinsing bath fluid used to rinse a substrate following cleaning has a different pH than the chemistry used during the prior cleaning step. In addition, contaminants may accumulate in the rinsing tank and may re-attach to a substrate as it is removed during drying. While such particle re-attachment may be reduced by adding chemicals to the rinsing fluid, adding chemistry to the final rinse tank may result in chemistry remaining on the substrate following drying.

In some embodiments provided herein, a system for rinsing and drying a substrate is provided that includes a movable tank that may translate between a substrate loading position at which substrates may be loaded into the tank, and a drying position. A drying station is located at the drying position and may be employed to rinse and dry substrates unloaded from the movable tank. In some embodiments, the tank may have a small volume, and/or be filled and drained for each substrate processed within the tank (e.g., to reduce particle build up and/or re-attachment due to accumulation of particles from multiple substrates being processed within the tank).

To increase throughput, in some embodiments, the tank may have two or more independent substrate processing compartments integrated into the same tank body. Fill and drain valve manifolds for each processing compartment may be integrated into the tank body to reduce space and/or reduce connection points between facilities and the system.

In some embodiments provided herein, particle re-attachment may be reduced and/or avoided by submerging a substrate into a chemistry within the tank, such as an acid or base, HCl acid, HF acid, an organic alkaline, tetramethylammonium hydroxide (TMAH), ammonium hydroxide, another pH adjuster, or the like, and then lifting the substrate out of the tank through a rinsing fluid source such as a waterfall, a top surface of which is blanketed with a flow of solvent such as an $N_2$/IPA gas mixture. The resultant rinsing fluid curtain may effectively rinse chemistry from the substrate, and the $N_2$/IPA gas over the rinsing fluid may provide Marangoni drying with reduced and/or minimized particle re-attachment.

Example embodiments for the system and/or methods of rinsing and drying substrates are described below.

FIGS. 1A-1R are side schematic views of an example system 100 for rinsing and drying substrates in accordance with embodiments of the present invention. With reference to FIG. 1A, the system 100 includes a movable tank 102 and a drying station 104. In the embodiment of FIGS. 1A-1R, the drying station 104 is stationary. However, in other embodiments, the drying station 104 may be movable (and/or the tank 102 may be stationary).

The movable tank 102 of FIG. 1A includes a first fillable and drainable compartment 106a configured to hold a cleaning chemistry so as to expose a substrate within the first compartment of the movable tank 102 to the cleaning chemistry, and a second fillable and drainable compartment 106b configured to hold a cleaning chemistry so as to expose a substrate within the second compartment of the movable tank 102 to the cleaning chemistry. In some embodiments, the movable tank 102 may include only a single fillable and drainable compartment or more than two fillable and drainable compartments.

In the embodiment of FIG. 1A, the movable tank 102 is movable between a first loading position, a second load position, a first drying position and a second drying position. For example, the loading and drying positions may be as shown in Table 1 below. Other loading and/or drying positions may be employed.

TABLE 1

| | |
|---|---|
| 1st LOADING POSITION | first compartment 106a at location L1 |
| 2nd LOADING POSITION | first compartment 106a at location L2; second compartment 106b at location L1 |
| 1st DRYING POSITION | first compartment 106a at location D1; second compartment 106b at location D2 |
| 2nd DRYING POSITION | second compartment 106b at location D1 |

The first compartment 106a of the movable tank 102 includes a first substrate holder 108a, and the second compartment 106b of the movable tank 102 includes a second substrate holder 108b. Each holder 108a, 108b is configured to hold a substrate within the compartment 106a, 106b of the movable tank 102, receive a substrate from an overhead substrate transfer mechanism 110 when the movable tank 102 is at the appropriate loading position, and unload a substrate from the compartment 106a or 106b of the movable tank 102 through the drying station 104 when the movable tank 102 is at the appropriate drying position (as described further below). Example embodiments of the movable tank 102 are described below with reference to FIGS. 2A-2C. The overhead substrate transfer mechanism 110 may be an overhead conveyor system, a running beam robot system or any other suitable mechanism for transferring substrates.

In the embodiment of FIGS. 1A-1R, the drying station 104 includes rinsing fluid sources 112a, 112b for supplying rinsing fluid to a frontside and a backside of a substrate passed through the drying station 104. For example, the rinsing fluid sources 112a, 112b may include nozzles, a spray bar, a waterfall apparatus as shown, or any other suitable mechanism for delivering rinsing fluid to a substrate. An example rinsing fluid source is described below with reference to FIG. 2A. Any suitable rinsing fluid may be used (e.g., de-ionized water, de-ionized water having a rinsing agent that reduces surface tension, gas-infused de-ionized water such as de-ionized water infused with $O_3$, $CO_2$, $N_2$, etc., and/or the like).

The drying station 104 may also include drying vapor sources 114a, 114b for delivering a drying vapor, such as a solvent vapor, to a frontside and/or backside rinsing fluid meniscus formed on a substrate as the substrate passes by rinsing fluid sources 112a, 112b and is sprayed by rinsing fluid during a rinsing and drying operation with the drying station 104. In such embodiments, a substrate may be Marangoni dried as it passes through the drying station 104. During Marangoni drying with the system 100, a solvent vapor (such as IPA) miscible with the rinsing fluid is introduced to each fluid meniscus which forms as the substrate is lifted through the rinsing fluid sources 112a, 112b. The solvent vapor is absorbed along the surface of the rinsing fluid, with the concentration of the absorbed vapor being higher at the tip of each meniscus. The higher concentration of absorbed vapor causes surface tension to be lower at the tip of each meniscus than in the bulk of the rinsing fluid, causing rinsing fluid to flow from each drying meniscus toward the rinsing fluid. Such a flow is known as a "Marangoni" flow, and can be employed to achieve substrate drying without leaving streaks, spotting or rinsing fluid residue on the substrate.

An example operation of the rinsing and drying system 100 is now described with reference to FIGS. 1A-1R. With reference to FIG. 1A, the movable tank 102 is moved to the first loading position, with first compartment 106a and first substrate holder 108a positioned under a first substrate 116a supported by overhead substrate transfer mechanism 110. In FIG. 1B, the first substrate holder 108a raises to support first substrate 116a, and to receive first substrate 116a from the overhead substrate transfer mechanism 110. In FIG. 1C, the first substrate holder 108a lowers to position the first substrate 116a within the first compartment 106a of movable tank 102. The first compartment 106a of the movable tank 102 is then filled with a cleaning chemistry.

Example cleaning chemistries include an acid or base, HCl acid, HF acid, an organic alkaline, tetramethylammonium hydroxide (TMAH), ammonium hydroxide, another pH adjuster, or the like. In some embodiments, the cleaning chemistry and/or the pH of the cleaning chemistry used in either compartment 106a, 106b of the movable tank 102 may be selected or otherwise set based on a process performed on a substrate prior to the substrate being loaded into the movable tank 102. For example, the chemistry utilized in the movable tank 102 may be the same chemistry utilized in a brush box or brush scrubbing tool used to clean the substrate prior to the substrate being loaded into the rinsing and drying system 100. Other example cleaning chemicals include PlanarClean available from ATMI of Danbury, Conn., CX100 available from Wako Chemicals USA of Richmond, Va., CP98 available from Air Products of Allentown, Pa., and/or any other suitable chemistry.

With reference to FIG. 1D, the movable tank 102 is moved to the second loading position, with second compartment 106b and second substrate holder 108b positioned under a second substrate 116b supported by overhead substrate transfer mechanism 110. In FIG. 1E, the second substrate holder 108b raises to support second substrate 116b, and to receive the second substrate 116b from the overhead substrate transfer mechanism 110. In FIG. 1F, the second substrate holder 108b lowers to position second substrate 116b within the second compartment 106b of movable tank 102. The second compartment 106b of the movable tank 102 is then filled with a cleaning chemistry. The same or a different chemistry used to fill the first compartment 106a may be used to fill the second compartment 106b. The first and/or second substrate 116a, 116b may be exposed to the cleaning chemistry for any suitable time. In some embodiments, the first and/or second substrate 116a, 116b may be exposed to the cleaning chemistry within the movable tank 102 for at least 5 seconds, in some embodiments at least 10 seconds, and in some embodiments at least 20 seconds. Other exposure times may be used. For example, different exposure times may be employed for different chemistries, different concentrations of chemical additives, etc.

In FIG. 1G, the movable tank 102 is moved to the first drying position, with first compartment 106a positioned below the drying station 104. In FIG. 1H, the first substrate holder 108a unloads and raises first substrate 116a through drying station 104 to rinse the first substrate 116a with a rinsing fluid and dry the first substrate 116a as the first substrate 116a is unloaded from the first compartment 106a of the movable tank 102 through the drying station 104. For example, the rinsing fluid sources 112a, 112b may create a uniform rinsing fluid curtain (e.g., waterfall) through which the first substrate 116a may be moved, effectively rinsing both sides of the substrate 116a. The addition of a solvent gas flow from drying vapor sources 114a, 114b, such as nitrogen/IPA, above the rinsing fluid curtain enables effective drying of the first substrate 116a through the Marangoni process. Robust rinsing and drying of the substrate 116a may be provided through uniform rinsing fluid flow across the length of the substrate 116a.

Example substrate travel rates during rinsing and drying with the drying station 104 range from about 15 to 35 mm/sec, and in some embodiments about 20 to 30 mm/sec, although faster or slower travel rates may be employed.

In FIG. 1I the first substrate 116a passes through the drying station 104 and may be removed from the first substrate holder 108a. In some embodiments, the first substrate 116a may change orientations (e.g., be switched from vertical to horizontal or vice versa by a suitable mechanism, as described further below, and as shown in phantom).

In FIG. 1J, the cleaning chemistry from the first compartment 106a of the movable tank 102 is drained and the first substrate holder 108b is lowered back into the first compartment 106a. As stated, in some embodiments, the volume of each compartment 106a, 106b in the movable tank 102 may be kept small to enable a fast drain-and-fill sequence. For example, in some embodiments, the volume of each compartment 106a, 106b may be about 2.5 Liters or less, and in some embodiments about 2 Liters or less. Other volumes may be employed. In some embodiments, the first compartment 106a and/or second compartment 106b may be drained and refilled in less than about 15 seconds, and in some embodiments, less than about 10 seconds.

As shown in FIG. 1K, the movable tank 102 is moved to the first loading position, with first compartment 106a and first substrate holder 108a positioned under a third substrate 116c supported by overhead substrate transfer mechanism 110. In FIG. 1L, the first substrate holder 108a raises to support third substrate 116c, and to receive third substrate 116c from the overhead substrate transfer mechanism 110. In FIG. 1M, the first substrate holder 108a lowers to position the third substrate 116c within the first compartment 106a of movable tank 102. The first compartment 106a of the movable tank 102 is then filled with a cleaning chemistry.

As stated, the same or a different chemistry may be used to fill the first compartment 106a and second compartment 106b. The first, second and/or third substrate 116a, 116b, 116c may be exposed to cleaning chemistry for any suitable time. In some embodiments, the substrate 116a, 116b, 116c may be exposed to the cleaning chemistry within the movable tank 102 for at least 5 seconds, in some embodiments at least 10 seconds, and in some embodiments at least 20 seconds. Other exposure times may be used. For example, different exposure times may be employed for different chemistries, different concentrations of chemical additives, etc.

The movable tank 102 may be moved to the second drying position, with second compartment 106b positioned below the drying station 104. In the embodiment shown, the movable tank 102 is sized so that the second compartment 106b is positioned below the drying station 104 when the first compartment 106a is positioned below the overhead substrate transfer mechanism 110 (that is, the second drying position and the first loading position are the same for the movable tank 102). In general this may not be the case, depending on such factors as the distance between the first and second compartments 106a, 106b, the positions of the first and second substrate holders 108a, 108b, the location of the overhead substrate transfer mechanism 110, the distances between the substrate transfer mechanism 110 and the drying station 104, and/or the like.

In FIG. 1N, the second substrate holder 108b unloads and raises second substrate 116b through drying station 104 to rinse the second substrate 116b with a rinsing fluid and dry the second substrate 116b as the second substrate 116b is unloaded from the second compartment 106b of the movable tank 102 through the drying station 104. For example, the rinsing fluid sources 112a, 112b may create a uniform rinsing fluid curtain (e.g., waterfall) through which the second substrate 116b may be moved, effectively rinsing both sides of the substrate 116b. The addition of a solvent gas flow from drying vapor sources 114a, 114b, such as nitrogen/IPA, above the rinsing fluid curtain enables effective drying of the second substrate 116b through the Marangoni process. Robust rinsing and drying of the substrate 116b may be provided through uniform rinsing fluid flow across the length of the substrate.

In FIG. 1O, the second substrate 116b passes through the drying station 104 and may be removed from the second substrate holder 108b. In some embodiments, the second substrate 116b may change orientations (e.g., be switched from vertical to horizontal or vice versa by a suitable mechanism, as described further below, and as shown in FIG. 1P).

In FIG. 1P, the cleaning chemistry from the second compartment 106b of the movable tank 102 is drained and the second substrate holder 108b is lowered back into the second compartment 106b.

As shown in FIG. 1Q, the movable tank 102 is moved to the second loading position, with second compartment 106b and second substrate holder 108b positioned under a fourth substrate 116d supported by overhead substrate transfer mechanism 110. The second substrate holder 108b raises to support fourth substrate 116d, and to receive fourth substrate 116d from the overhead substrate transfer mechanism 110. In FIG. 1R, the second substrate holder 108b lowers to position the fourth substrate 116d within the second compartment 106b of movable tank 102. The second compartment 106b of the movable tank 102 is then filled with a cleaning chemistry.

The above steps may be repeated for processing subsequent substrates. For example, additional substrates may be similarly loaded into movable tank 102, exposed to a cleaning chemistry for a desired time period, positioned below the drying position (by translating movable tank 102), unloaded from the movable tank through the drying station, and rinsed with a rinsing fluid and dried as the substrates are unloaded from the movable tank 102 through the drying station 104. Other loading, unloading, rinsing and/or drying sequences may be employed.

FIG. 1S is a side schematic view of a first alternative system 100' for rinsing and drying substrates in accordance with embodiments of the present invention. With reference to FIG. 1S, the system 100' includes a movable tank 102 and a drying station 104. In the embodiment of FIG. 1S the drying station 104 is stationary. However, in other embodiments, the drying station 104 may be movable (and/or the tank 102 may be stationary).

The movable tank 102 of FIG. 1S includes a single fillable and drainable compartment 106c configured to hold a cleaning chemistry so as to expose a substrate within the compartment 106c of the movable tank 102 to the cleaning chemistry. The movable tank 102 is movable between a loading position L1 and a drying position D1 (as shown).

The system 100' of FIG. 1S may operate similarly to the system 100 of FIGS. 1A-1R, but processes a single substrate at a time. The compartment 106c of the movable tank 102 includes a substrate holder 108c configured to hold a substrate within the movable tank 102, receive a substrate (such as substrate 116e in FIG. 1S) from an overhead substrate transfer mechanism 110 when the movable tank 102 is at the loading position L1, expose the substrate 116e to a cleaning chemistry within the compartment 106c for a predetermined time period, and unload the substrate 116e from the compartment 106c of the movable tank 102 through the drying station 104 when the movable tank 102 is at the drying position D1.

The described systems for rinsing and drying a substrate may be configured to (1) load a substrate into a movable tank while the movable tank is at a loading position; (2) fill the movable tank with a cleaning chemistry; (3) treat the substrate with the cleaning chemistry for a predetermined time period; (4) move the movable tank to a drying position; (5) unload the substrate from the movable tank through a drying station; and (6) rinse the substrate with a rinsing fluid and dry the substrate as the substrate is unloaded from the movable tank through the drying station.

Figure 1T:
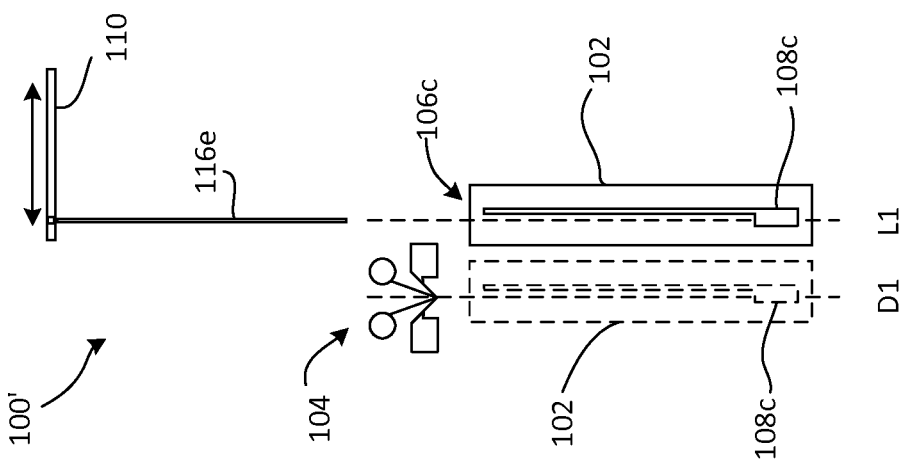
FIG. 1T is a side schematic view of a second alternative system for rinsing and drying substrates in accordance with embodiments of the present invention.

FIG. 1T is a side schematic view of a second alternative system 100" for rinsing and drying substrates in accordance with embodiments of the present invention. With reference to FIG. 1T, the system 100' includes a first substrate holder 108a located at a loading position L1 and a second substrate holder 108b located at a drying position D1. Instead of employing a movable tank to move a substrate between the loading position L1 and drying position D1, a translating mechanism is provided to transfer a substrate loaded onto first substrate holder 108a to second substrate holder 108b. For example, a substrate lift 120 may be employed to lift a substrate off of first substrate holder 108a and transfer the substrate to second substrate holder 108b. The substrate lift 120 may linearly and/or rotationally transfer substrates between the first and second substrate holders 108a, 108b, for example.

As shown in FIG. 1T, because no movable tank is employed, both the loading position L1 and the drying position D1 may include a cleaning chemistry delivery mechanism 122a, 122b, such as spray nozzles, spray bars, waterfall apparatus, and/or the like. The cleaning chemistry delivery mechanism 122a may spray and/or otherwise coat a substrate located at loading position L1 with cleaning chemistry, and cleaning chemistry delivery mechanisms 122b may spray and/or otherwise coat a substrate located at drying position D1. By coating a substrate with cleaning chemistry at both locations, the cleaning chemistry delivery mechanisms 122a and 122b may be operate similarly to the movable tank 102, by exposing a substrate to cleaning chemistry for a predetermined time prior to rinsing and drying with the drying station 104.

The system 100" of FIG. 1T may operate similarly to the system 100' of FIG. 1S. A first substrate 116f may be loaded onto first substrate holder 108a at loading position L1. The first substrate 116f may be sprayed with cleaning chemistry at loading position L1 using cleaning chemistry delivery mechanism 122a, and transferred to drying position D1 (using substrate lift 120). The substrate 116f then may be sprayed with additional cleaning chemistry at drying position D1 using cleaning chemistry delivery mechanism 122*b* until substrate 116*f* has been exposed to cleaning chemistry for a desired and/or predetermined time period. Thereafter, the substrate 116*f* may be transferred through drying station 104 to rinse and drying the substrate 116*f* as previously described. Once substrate 116*f* leaves first substrate holder 108*a*, first substrate holder 108*a* may be employed to retrieve a second substrate 116*g* from overhead substrate transfer mechanism 110 for processing within the system 100'.

Figure 2A:
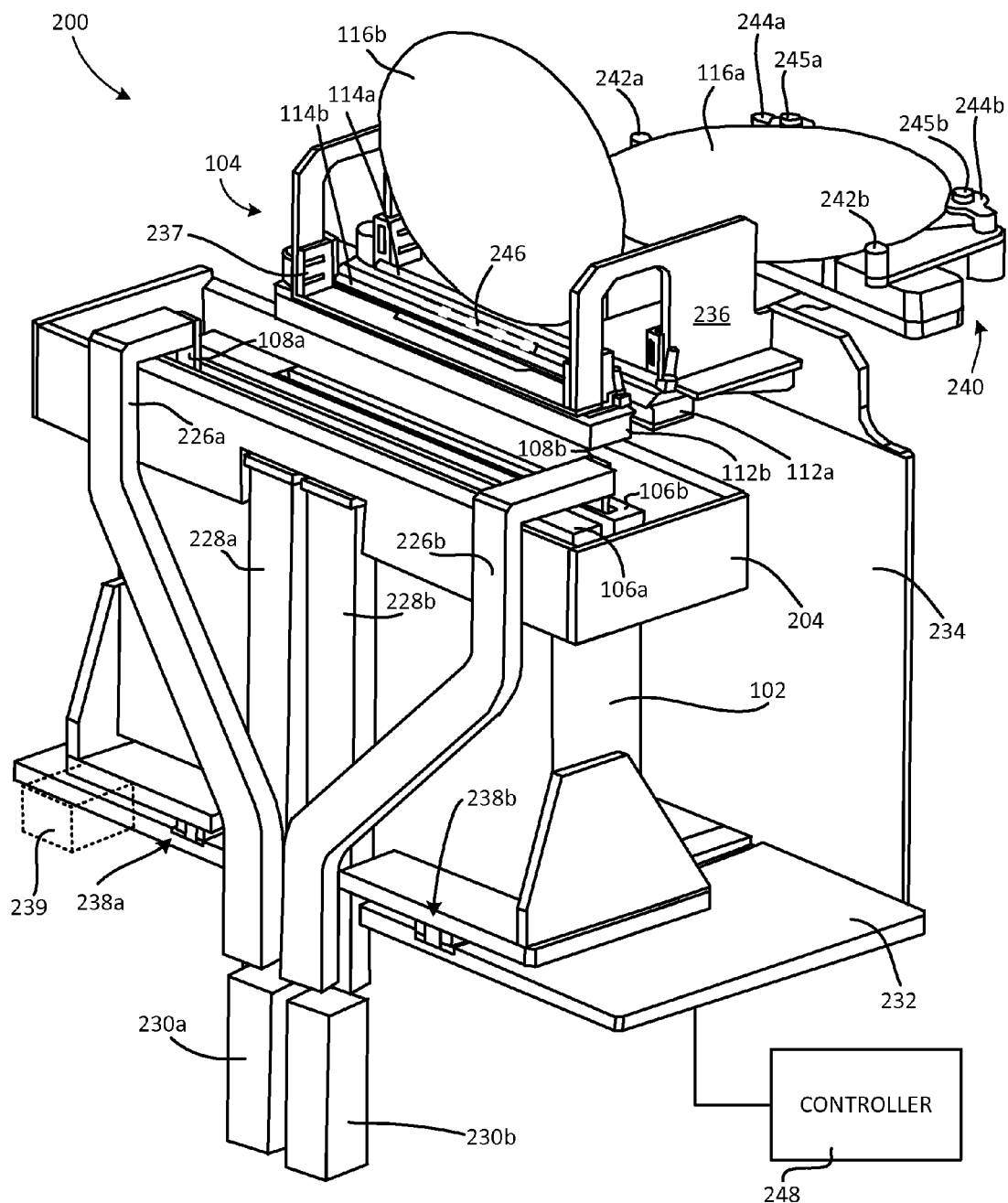
FIG. 2A is a perspective view of another example embodiment of a rinsing and drying system provided in accordance with one or more embodiments of the invention.
Figure 2B:
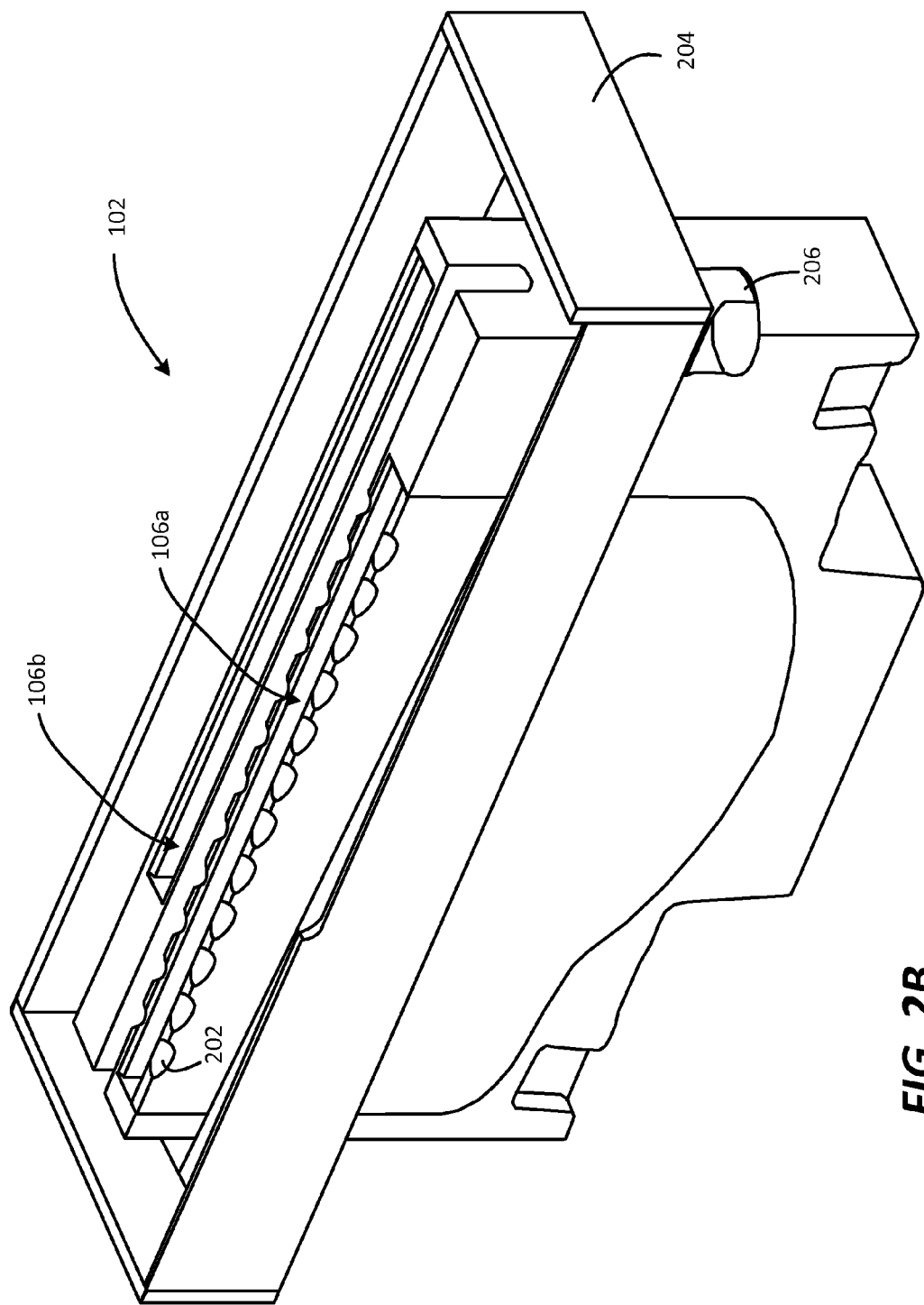
FIGS. 2B and 2C are a perspective view and front cross-sectional view, respectively, of an example embodiment of the movable tank of FIG. 2A.
Figure 2C:
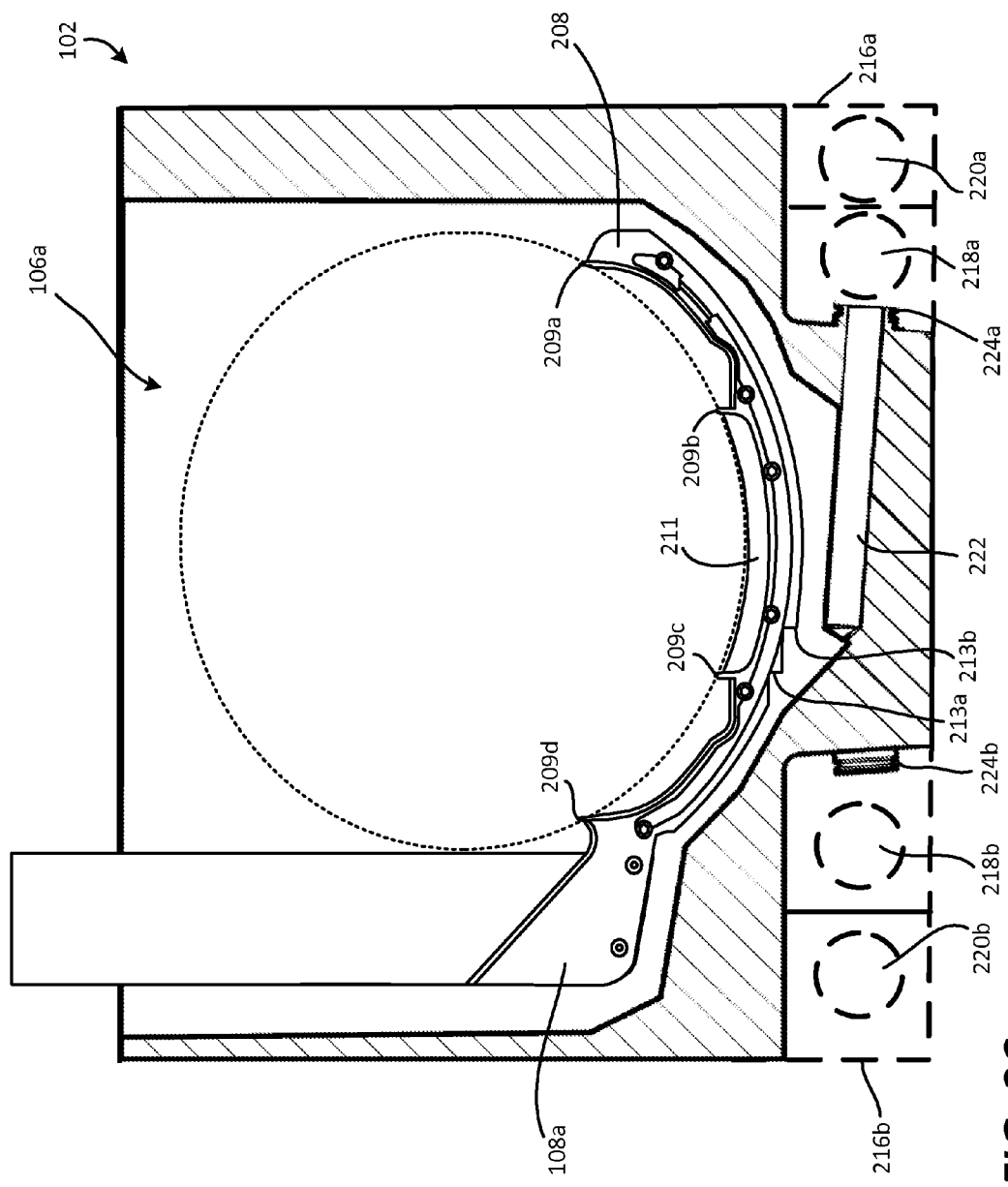

FIG. 2A is a perspective view of another example embodiment of a rinsing and drying system 200 provided in accordance with one or more embodiments of the invention. FIGS. 2B and 2C are a perspective view and front cross-sectional view, respectively, of an example embodiment of the movable tank 102 of FIG. 2A. With reference to FIG. 2A, the system 200 includes the movable tank 102 and drying station 104. In the embodiment of FIG. 2A, the drying station 104 is stationary. However, in other embodiments, the drying station 104 may be movable (and/or the tank 102 may be stationary).

The movable tank 102 includes first fillable and drainable compartment 106*a* configured to hold a cleaning chemistry so as to expose a substrate within the first compartment 106*a* of the movable tank 102 to the cleaning chemistry, and second fillable and drainable compartment 106*b* configured to hold a cleaning chemistry so as to expose a substrate within the second compartment 106*b* of the movable tank 102 to the cleaning chemistry. In some embodiments, the movable tank 102 may include only a single fillable and drainable compartment or more than two fillable and drainable compartments.

With reference to FIG. 2B, the first compartment 106*a* is shown having scalloped regions 202 formed within the upper surface of the first compartment 106*a*. These scalloped regions 202 are regions of the upper surface in which tank material is removed to aid in flow of cleaning chemistry, rinsing fluid, or the like over the upper surface of the first compartment 106*a* during cleaning and/or rinsing of a substrate contained in and/or being unloaded from the first compartment 106*a*. For example, the sharper edges provided by the scalloped regions 202 may assist in overcoming surface tension associated with the cleaning chemistry and/or rinsing fluid. The second compartment 106*b* may be similarly configured. Other shapes and/or configurations may be used to reduce surface tension effects.

In some embodiments, the movable tank 102 may be formed from PEEK, polyvinylidene difluoride (PVDF), polytetrafluoroethylene (PTFE), metal with a PTFE coating, polypropylene, and/or the like. Any other suitable tank material may be employed.

As shown in FIGS. 2A and 2B, an overflow weir 204 may be provided to capture cleaning chemistry, rinsing fluid, a combination of the same, and/or the like that overflows from the first and/or second compartments 106*a*, 106*b* during loading, unloading, cleaning, rinsing and/or drying within the system 200. The overflow weir 204 may include one or more drains 206 (FIG. 2B; not shown in FIG. 2A) for facilitating removal and/or reuse of fluid from the overflow weir 204.

The first compartment 106*a* of the movable tank 102 includes first substrate holder 108*a*, and the second compartment 106*b* of the movable tank 102 includes second substrate holder 108*b* as previously described. FIG. 2C illustrates an example embodiment of the first substrate holder 108*a*. The second substrate holder 108*b* may be similarly configured.

In some embodiments, the first and/or second substrate holder 108*a*, 108*b* may include a frame 208 having multiple substrate contact supports 209*a-d* configured to contact and support a substrate. These supports may be v-shaped or otherwise-shaped to facilitate draining of fluid from the substrate holder 108*a*, 108*b* when the substrate holder 108*a*, 108*b* is removed from a fluid bath. In some embodiments, one or more of the substrate contact supports 209*a-d* may include a vacuum port (not shown) for applying a vacuum at one or more of the supports 209*a-d*, to further assist in fluid removal. Additionally or alternatively, a slit-shaped vacuum port 211 may be provided between supports 209*b* and 209*c*. Vacuum may be applied to the one or more vacuum ports via vacuum inlets 213*a-b*, for example. The one or more vacuum ports may be operable to apply a vacuum at one or more locations along the bottom edge of a substrate. As such, liquid residue, which formerly could collect at such substrate supports and/or along a bottom edge of a substrate, may be removed. Example substrate holders are described in previously incorporated U.S. application Ser. No. 14/593, 841, filed Jan. 9, 2015. Any other suitable substrate holders may be employed.

In some embodiments, movable tank 102 may have an interior shape based on a shape of the substrate holder 108*a* and/or 108*b*. For example, as shown in FIG. 2C, the first compartment 106*a* has a shape that approximately follows an outline of the first substrate holder 108*a*. The second compartment 106*b* of the movable tank 102 may be similarly shaped. In this manner, an interior volume of each compartment 106*a*, 106*b* may be reduced, allowing consumption of less cleaning chemistry and faster filling and draining of each compartment.

In one or more embodiments, each compartment 106*a*, 106*b* of the movable tank 102 may include a manifold 216*a*, 216*b* (shown in phantom) having both a drain valve/connection 218*a*, 218*b* and fill valve/connection 220*a*, 220*b* within a footprint of the movable tank 102 (FIG. 2C). A drain may be provided from each compartment 106*a*, 106*b* to each respective manifold 216*a*, 216*b* to allow draining and/or filling of each compartment 106*a*, 106*b*. As shown in FIG. 2C, a drain 222 couples a bottom portion of first compartment 106*a* to the first manifold 216*a*. In some embodiments, the drain 222 may be angled at about 2 to 10 degrees from horizontal to facilitate rapid draining of the first compartment 106*a*. The drain (not shown) of the second compartment 106*b* may be similarly configured. Other drain angles may be used.

In some embodiments, the manifolds 216*a*, 216*b* may be sealed to the tank body via a radial seal (not shown) on a nipple 224*a*, 224*b* that protrudes from the tank body. In one or more embodiments, first and second compartments 106*a*, 106*b* may be machined into material used to form the tank 102, allowing a complex geometry for each compartment (e.g., contoured to the shape of a substrate holder to reduce volume of each compartment 106*a*, 106*b*). In some embodiments, the outer (side) surfaces of the tank 102 may be thermally fit and/or welded to a central core when the tank 102 is assembled.

In some embodiments, the drain and/or manifolds 216*a*, 216*b* may be designed such that the drain point of each compartment 106*a*, 106*b* is the lowest point in each compartment (e.g., to improve draining). The drain valves 218*a*, 218*b* may be integrated with the tank 102 to allow rapid draining of each compartment 106*a*, 106*b*. In some embodiments, the fill valves 220a, 220b may be located outside the drain valves 218a, 218b as shown. This may allow incoming fluid to enter the tank 102 quickly with little or no splashing. A rapid dump of the cleaning fluid from first and second compartments 106a, 106b after a substrate is processed helps ensure that particles suspended in the fluid are flushed out and do not adhere to the walls of the tank 102.

In some embodiments, and as shown in FIG. 2A, the first substrate holder 108a may be coupled to a first support member 226a slidingly coupled to a first guide rail 228a (coupled to movable tank 102), and the second substrate holder 108b may be coupled to a second support member 226b slidingly coupled to a second guide rail 228b (coupled to movable tank 102). A first actuator 230a, such as a linear motor, may cause first support member 226a to raise and/or lower along first guide rail 228a, which in turn causes first substrate holder 108a to raise and/or lower within first compartment 106a of movable tank 102. Likewise, a second actuator 230b, such as a linear motor, may cause second support member 226b to raise and/or lower along second guide rail 228b, which in turn causes second substrate holder 108b to raise and/or lower within second compartment 106b of movable tank 102.

As shown in FIG. 2A, in some embodiments, the movable tank 102 may be supported via a base plate 232, and the drying station 104 may be supported above the movable tank 102 using a support plate 234 and a support frame 236. For example, the base plate 232 may be coupled to the movable tank 102 using one or more slide bearings or tracks 238a-b that allow the movable tank 102 to translate relative to the base plate 232 (under control of an actuator such as a motor 239, shown in phantom).

In the embodiment of FIG. 2A, the drying station 104 includes waterfall-type rinsing fluid sources 112a, 112b coupled to the support frame 236 for supplying rinsing fluid to a frontside and a backside of a substrate passed through the drying station 104. Other rinsing fluid sources may include nozzles, a spray bar, or any other suitable mechanism for delivering rinsing fluid to a substrate. Any suitable rinsing fluid may be used (e.g., de-ionized water, de-ionized water having a rinsing agent that reduces surface tension, gas-infused de-ionized water such as de-ionized water infused with $O_3$, $CO_2$, $N_2$, etc.). In some embodiments, the waterfall source is formed by forcing fluid flow through a narrow planar slot (e.g., formed between two waterfall portions or plates). For example, rinsing fluid may be introduced into a first plenum, and travel through a restricted fluid path to a second plenum to create a uniform pressure distribution as rinsing fluid pressure decreases when the rinsing fluid exits the restricted fluid path and expands into the second plenum. The rinsing fluid then may exit a slot formed between the waterfall portions to form a rinsing fluid waterfall. Example waterfall apparatus are described in previously incorporated U.S. Application Ser. No. 62/094,938, filed Dec. 19, 2014. Any other suitable rinsing fluid sources may be employed.

The drying station 104 may also include drying vapor sources 114a, 114b for delivering a drying vapor, such as a solvent vapor, to a frontside and/or backside rinsing fluid meniscus formed on a substrate as it passes by rinsing fluid sources 112a, 112b and is sprayed by rinsing fluid during a rinsing and drying operation with the drying station 104. In such embodiments, a substrate may be Marangoni dried as it passes through the drying station 104. During Marangoni drying with the system 200, a solvent vapor (such as IPA) miscible with the rinsing fluid is introduced to each fluid meniscus which forms as the substrate is lifted through the rinsing fluid sources 112a, 112b. The solvent vapor is absorbed along the surface of the rinsing fluid, with the concentration of the absorbed vapor being higher at the tip of each meniscus. The higher concentration of absorbed vapor causes surface tension to be lower at the tip of each meniscus than in the bulk of the rinsing fluid, causing rinsing fluid to flow from each drying meniscus toward the rinsing fluid. Such a flow is known as a Marangoni flow, and can be employed to achieve substrate drying without leaving streaks, spotting or rinsing fluid residue on the substrate.

In some embodiments, the position, height and/or rotation of the rinsing fluid sources 112a, 112b and/or the drying vapor sources 114a, 114b may be adjustable relative to the support frame 236. For example, adjustable clamps, slide bearings, adjustment screws or bolts or the like (see for example adjustment clamp 237) may be employed to adjust the height of and/or spacing between the rinsing fluid sources 112a, 112b and/or drying vapor sources 114a, 114b. Similarly, a pivot mechanism (not shown), such as a slotted guide, may be employed to adjust rotation of each rinsing fluid sources 112a, 112b and/or drying vapor sources 114a, 114b. The base plate 232, support plate 234 and/or support frame 236 may be formed from any suitable material such as aluminum, stainless steel, PEEK, a combination of the same, or the like.

A gripper apparatus 240 may be provided at an output of the drying station 104. In the embodiment shown, the gripper apparatus 240 includes a plurality of lower fingers 242a-b and pivotable fingers 244a-b that may contact and/or support an edge of a substrate. One or more actuators (not shown) may open and close the gripper apparatus 240. In some embodiments, the gripper apparatus 240 may change the orientation of a substrate between a vertical orientation and horizontal orientation (via one or more actuators not shown). In some embodiments, upon transitioning to a vertical orientation, the first and second edge support features 245a, 245b of the first and second pivoting fingers 244a, 244b may come into contact with and apply a gripping force to an edge a substrate. This gripping force pinches the substrate between the first and second pivoting fingers 244a, 244b and the first and second lower fingers 242a, 242b and holds the substrate. Example gripper apparatus are described in previously incorporated U.S. application Ser. No. 14/602,094, filed Jan. 21, 2015. Any other suitable gripping and/or substrate supporting apparatus may be employed to contact, remove and/or support a substrate from one of the substrate holders 108a, 108b following a rinse/dry operation within the rinsing and drying system 200.

A supplemental drying apparatus may be employed in some embodiments to further aid the drying process. For example, a substrate edge residue removal apparatus 246 (shown in phantom) may be configured to eliminate or minimize rinsing fluid at the bottom of a substrate and/or at substrate holder support contact points should rinsing fluid remain following a rinsing/dry process (e.g., following drying vapor sources 114a, 114b). An example embodiment may include a two piece assembly formed from a lower body and an upper plate. Gas may be flowed through the assembly and exits, in some embodiments maintaining laminar flow, via a thin slit formed between the two pieces of the assembly. The assembly may be angled downward and in some embodiments is only activated as the lower third of a substrate is passed by the slit. The assembly may be activated to create a vapor or gas curtain on the major surface of a substrate that pushes any residue off the substrate face and edge. Example drying apparatus are described in previously incorporated U.S. application Ser. No. 14/602,114, filed Jan. 21, 2015. Other suitable drying apparatus may be employed.

In some embodiments, the rinsing and drying system 200 may include a controller 248 configured to control at least a portion of the operation of the system 200. For example, the controller 248 may be configured to control movement of the tank 102 (via motor 239), raising and/or lowering of substrate holders 108a, 108b (via motors 230a, 230b), filling and draining of the first and second compartments 106a, 106b of the tank 102 (via manifolds 216a, 216b), rinsing and/or drying of substrates (via rinsing fluid sources 112a, 112b drying vapor sources 114a, 114b and/or substrate edge residue removal apparatus 246), gripping and/or rotation of the gripper 240 to change orientation of a substrate from vertical to horizontal, and/or the like. The controller 248 may be a processor, such as a microprocessor, a central processing unit (CPU), a microcontroller, dedicated hardware circuitry, a combination of the same, or the like, for example. The controller 248 may include computer program code and/or one or more computer program products for performing at least a portion of one or more of the methods described herein. Each computer program product described herein may be carried by a non-transitory medium readable by a computer (e.g., a floppy disc, a compact disc, a DVD, a hard drive, a random access memory, etc.).

The system 200 of FIGS. 2A-2C may be operated, for example, in a manner similar to the process described with reference to FIGS. 1A-1R. Other sequences of operation may be employed.

In at least one embodiment, the controller 248 may be configured to control the rinsing and drying system 200 to perform one or more of the following (1) move the movable tank 102 to a first loading position using the motor 239, for example; (2) load a first substrate into the first compartment 106a of the movable tank 102 from an overhead substrate transfer mechanism 110 (FIG. 1A) using first support member 226a, first substrate holder 108a and first actuator 230a; (3) fill the first compartment 106a of the movable tank 102 with a cleaning chemistry using first manifold 216a; (4) move the movable tank 102 to the second loading position (e.g., using motor 239); (5) load a second substrate into the second compartment 106b of the movable tank 102 from the overhead substrate transfer mechanism 110 (FIG. 1A) using second support member 226b, second substrate holder 108b and second actuator 230b; (6) fill the second compartment 106b of the movable tank 102 with a cleaning chemistry using second manifold 216b; (7) move the movable tank 102 to a first drying position (in which the first compartment 106a is below the drying station 104); (8) unload the first substrate from the first compartment 106a of the movable tank 102 through the drying station 104 (using first substrate holder 108a); (9) rinse the first substrate with a rinsing fluid and dry the first substrate using the rinsing fluid sources 112a, 112b and drying vapor sources 114a, 114b as the first substrate is unloaded from the first compartment 106a of the movable tank 102 through the drying station 104; (10) drain the first compartment 106a of the movable tank 102 (via first manifold 216a); (11) move the movable tank 102 to the first loading position; (12) load a third substrate into the first compartment 106a of the movable tank 102 from the overhead substrate transfer mechanism 110; (13) fill the first compartment 106a of the movable tank 102 with a cleaning chemistry; (14) position the movable tank 102 at second drying position (in which the second compartment 106b is below the drying station 104); (15) unload the second substrate from the second compartment 106b of the movable tank 102 through the drying station 104; (16) rinse the second substrate with a rinsing fluid and drying the second substrate using the drying station 104 as the second substrate is unloaded from the second compartment 106b of the movable tank 102 through the drying station 104; (17) drain the second compartment 106b of the movable tank 102 (via second manifold 216b); (18) move the movable tank 102 to the second loading position; (19) load a fourth substrate into the second compartment 106b of the movable tank 102 from the overhead substrate transfer mechanism 110; and/or (20) fill the second compartment 106b of the movable tank 102 with a cleaning chemistry. Other cleaning, rinsing and/or drying processes and/or sequences may be employed. In general, the movable tank 102 may be movable along a programmable axis in any suitable manner.

In some embodiments, substrates that pass through the drying station 104 may be further dried using substrate edge residue removal apparatus 246. In some embodiments, substrates that pass through the drying station 104 may be removed from substrate holder 108a, 108b using gripper 240. The gripper 240 may rotate the substrates from a vertical to a horizontal orientation for subsequent processing, for example. Controller 248 may control operation of one or more of the substrate edge residue removal apparatus 246 and gripper 240.

As the rinsing fluid sources 112a, 112b spray rinsing fluid into the first and/or second compartments 106a, 106b of movable tank 102 during rinsing/drying, the compartments overflow. In embodiments in which several liters per minute of rinsing fluid are employed, overflowing of the compartments 106a, 106b may occur quickly. The overflow weir 204 may capture this overflowing liquid, and the liquid may be routed to a process drain. The rinsing fluid (e.g., DI water) flowing into the compartment 106a and/or 106b dilutes the chemical concentration of the cleaning chemistry in the compartment(s), bringing the pH of the cleaning chemistry closer to the final pH of the rinsing fluid. This pH transition and/or gradient may lessen any re-attachment of particles to substrates being processed with the movable tank 102. To further reduce particle re-attachment, the compartments 106a and/or 106b may be quickly filled and drained. In some embodiments, each compartment 106a, 106b may be filled in approximately 5-10 seconds, and drained in approximately 4-7 seconds. Other fill and/or drain times may be employed.

Use of a cleaning chemistry within the movable tank 102 may reduce particle re-attachment due to pH shock. For example, some embodiments may include setting a pH for the cleaning chemistry within the movable tank 102 based on a process performed on a substrate prior to the substrate being loaded into the movable tank 102. Particle re-attachment may be further reduced by draining each compartment 106a, 106b and refilling each compartment 106a, 106b with fresh cleaning chemistry for each substrate processed (e.g., particle re-attachment may be reduced because particles do not accumulate from multiple substrates in the same cleaning fluid and substrate-to-substrate uniformity/consistency may be improved). Use of two substrate processing compartments allows substrates to soak during load/unload operations, improving system throughput.

Embodiments provided herein may provide a non-contact chemical final clean to a substrate surface followed by a single pass rinse and Marangoni dry step. Chemical mechanical brush scrubbing is effective in removing particles attached to the surface of a substrate due to van der Waals interactions. The mechanical action of the brushes provides hydrodynamic drag force that breaks the bond between a particle and substrate surface. The chemistry composition and pH used during brush scrubbing may be adjusted so that both the substrate surface and the particles to be removed therefrom have a charge of the same sign, promoting electrostatic repulsion between the substrate surface and particles. When the bond between the substrate surface and particles is broken, the particle may remain in a boundary layer near the substrate surface, and electrostatic repulsion may prevent particle re-deposition. As a substrate is moved from brush scrubbing to a rinsing tank, an abrupt change in the pH in the boundary layer of the substrate surface may result in cause particle re-deposition onto the surface of the substrate. Using a cleaning chemistry within the movable tank 102 having a pH similar to that used during brush scrubbing may reduce such particle re-deposition/re-attachment.

The foregoing description discloses only example embodiments of the invention. Modifications of the above-disclosed systems, apparatus, and methods which fall within the scope of the invention will be readily apparent to those of ordinary skill in the art. For instance, in some embodiments, the rinsing and drying systems and methods described herein may be configured for processing horizontally oriented substrates. Accordingly, while the present invention has been disclosed in connection with example embodiments thereof, it should be understood that other embodiments may fall within the scope of the invention, as defined by the following claims.

What is claimed is:
1. A system comprising:
a loading position;
a drying position laterally spaced from the loading position;
a drying station located at the drying position; and
a movable tank configured to:
   hold at least one substrate;
   hold a cleaning chemistry so as to expose a substrate within the movable tank to the cleaning chemistry; and
   translate relative to the drying station between the loading position and the drying position; and
wherein the drying station is above the moveable tank when the moveable tank is located at the drying position and includes a rinsing fluid source and a vapor drying source configured to rinse and dry a substrate as the substrate is unloaded from the movable tank when the movable tank is at the drying position.

2. The system of claim 1 wherein the loading position is below an overhead substrate transfer mechanism.

3. The system of claim 1 wherein the movable tank is configured to drain following unloading of a substrate and re-fill after receiving a subsequent substrate.

4. The system of claim 1 wherein the movable tank includes a manifold having both a drain valve and fill valve within a footprint of the movable tank.

5. The system of claim 1 wherein the movable tank is configured to hold 2 substrates.

6. The system of claim 1 further comprising a substrate holder configured to:
hold a substrate within the movable tank;
receive a substrate from an overhead substrate transfer mechanism when the movable tank is at the loading position; and
unload a substrate from the movable tank through the drying station when the movable tank is at the drying position.

7. The system of claim 6 wherein the movable tank has an interior shape based on a shape of the substrate holder.

8. The system of claim 1 further comprising at least a first loading position and a second loading position and at least a first drying position and a second drying position and wherein the movable tank is configured to move between the first and second loading positions and the first and second drying positions.

9. A method of operating the system of claim 1, comprising:
positioning the movable tank at the loading position;
loading a substrate into the movable tank while the movable tank is at the loading position;
filling the movable tank with a cleaning chemistry;
treating the substrate with the cleaning chemistry for a predetermined time period;
moving the movable tank to the drying position;
unloading the substrate from the movable tank through the drying station; and
rinsing the substrate with the rinsing fluid and drying the substrate with the vapor drying source as the substrate is unloading from the movable tank through the drying station.

10. The method of claim 9 further comprising setting a pH for the cleaning chemistry within the movable tank based on a process performed on the substrate prior to the substrate being loaded into the movable tank.

11. The method of claim 9 further comprising using the drying station to create a pH gradient in the movable tank by supplying rinsing fluid to the substrate while the substrate is unloaded from the movable tank.

12. The method of claim 9 further comprising providing at least a first and a second loading position and at least a first and a second drying position and wherein the movable tank is configured to translate between the first and second loading positions and the first and second drying positions.

13. The method of claim 12 further comprising:
moving the movable tank to the first loading position;
loading a first substrate into a first compartment of the movable tank from an overhead substrate transfer system;
filling the first compartment of the movable tank with a cleaning chemistry;
moving the movable tank to the second loading position;
loading a second substrate into a second compartment of the movable tank from the overhead substrate transfer system;
filling the second compartment of the movable tank with a cleaning chemistry;
moving the movable tank to the first drying position;
unloading the first substrate from the first compartment of the movable tank through the drying station; and
rinsing the first substrate with a rinsing fluid and drying the first substrate as the first substrate is unloaded from the first compartment of the movable tank through the drying station.

14. The method of claim 13 further comprising:
draining the first compartment of the movable tank;
moving the movable tank to the first loading position;
loading a third substrate into the first compartment of the movable tank from the overhead substrate transfer system;
filling the first compartment of the movable tank with a cleaning chemistry;
positioning the movable tank at the second drying position;

unloading the second substrate from the second compartment of the movable tank through the drying station; and rinsing the second substrate with a rinsing fluid and drying the second substrate as the second substrate is unloaded from the second compartment of the movable tank through the drying station.

15. A system comprising:
a first loading position, a second loading position, a first drying position and a second drying position all laterally spaced from one another;
a drying station located above the first and second drying positions;
a movable tank configured to translate relative to the drying station between the first and second loading positions and the first and second drying positions, the movable tank having:
  a first fillable and drainable compartment configured to hold a cleaning chemistry so as to expose a substrate within the first compartment of the movable tank to the cleaning chemistry; and
  a second fillable and drainable compartment configured to hold a cleaning chemistry so as to expose a substrate within the second compartment of the movable tank to the cleaning chemistry; and
wherein the drying station is located above the moveable tank when the moveable tank is in the first or second drying positions, and the drying station is configured to:
  rinse and dry a substrate with a rinsing fluid source and a vapor drying source as the substrate is unloaded from the first compartment of the movable tank when the movable tank is positioned below the drying station at the first drying position; and
  rinse and dry a substrate with a rinsing fluid source and a vapor drying source as the substrate is unloaded from the second compartment of the movable tank when the movable tank is positioned below the drying station at the second drying position.

16. The system of claim 15 further comprising a controller operative to control the system to:
  move the movable tank to the first loading position;
  load a first substrate into the first compartment of the movable tank from an overhead substrate transfer system;
  fill the first compartment of the movable tank with a cleaning chemistry;
  move the movable tank to the second loading position;
  load a second substrate into the second compartment of the movable tank from the overhead substrate transfer system;
  fill the second compartment of the movable tank with a cleaning chemistry;
  move the movable tank to the first drying position;
  unload the first substrate from the first compartment of the movable tank through the drying station; and
  rinse the first substrate with a rinsing fluid and dry the first substrate as the first substrate is unloaded from the first compartment of the movable tank through the drying station.

17. The system of claim 16 wherein the controller is further operative to control the system to:
  drain the first compartment of the movable tank;
  move the movable tank to the first loading position;
  load a third substrate into the first compartment of the movable tank from the overhead substrate transfer system;
  fill the first compartment of the movable tank with a cleaning chemistry;
  position the movable tank at the second drying position;
  unload the second substrate from the second compartment of the movable tank through the drying station; and
  rinse the second substrate with a rinsing fluid and dry the second substrate as the second substrate is unloaded from the second compartment of the movable tank through the drying station.

* * * * *